United States Patent
Yamatani

(10) Patent No.: US 8,841,625 B2
(45) Date of Patent: Sep. 23, 2014

(54) METHOD FOR THE DETECTION OF THE IRRADIANCE DISTRIBUTION IN AN EXTREME ULTRAVIOLET LIGHT SOURCE DEVICE AND AN EXTREME ULTRAVIOLET LIGHT SOURCE DEVICE

(75) Inventor: Daiki Yamatani, Gotenba (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 167 days.

(21) Appl. No.: 13/284,277

(22) Filed: Oct. 28, 2011

(65) Prior Publication Data

US 2012/0112077 A1  May 10, 2012

(30) Foreign Application Priority Data

Nov. 10, 2010  (JP) ................. 2010-251626

(51) Int. Cl.
| | | |
|---|---|---|
| G01J 1/42 | (2006.01) | |
| G03F 7/20 | (2006.01) | |
| G01J 1/06 | (2006.01) | |
| G02B 27/09 | (2006.01) | |
| G01J 1/58 | (2006.01) | |

(52) U.S. Cl.
CPC ............ *G01J 1/58* (2013.01); *G03F 7/70033* (2013.01); *G01J 1/4257* (2013.01); *G01J 1/429* (2013.01); *G01J 1/06* (2013.01); *G02B 27/0988* (2013.01)
USPC ............................. 250/372; 378/34; 378/35

(58) Field of Classification Search
USPC ...................................... 250/372; 378/34, 35
See application file for complete search history.

(56) References Cited

U.S. PATENT DOCUMENTS

| | | | | |
|---|---|---|---|---|
| 5,933,473 | A  * | 8/1999 | Kitaguchi et al. ............... | 378/57 |
| 7,312,459 | B2 * | 12/2007 | Amemiya et al. ............. | 250/372 |
| 7,427,766 | B2 | 9/2008 | Jonkers et al. | |
| 2003/0146391 | A1 * | 8/2003 | Kleinschmidt et al. ....... | 250/372 |
| 2006/0091328 | A1 | 5/2006 | Kanazawa | |
| 2007/0080307 | A1 * | 4/2007 | Bruijn et al. ............. | 250/504 R |
| 2010/0123086 | A1 | 5/2010 | Yamatani | |
| 2010/0140512 | A1 | 6/2010 | Suganuma et al. | |
| 2011/0079737 | A1 * | 4/2011 | Scholz et al. ............. | 250/504 R |

FOREIGN PATENT DOCUMENTS

JP  2007-505460 A  3/2007

OTHER PUBLICATIONS

European Search Report Dated Feb. 24, 2012 for European Application No. EP 11 00 8450.

* cited by examiner

*Primary Examiner* — Christine Sung
(74) *Attorney, Agent, or Firm* — Roberts Mlotkowski Safran & Cole, P.C.; David S. Safran

(57) ABSTRACT

An extreme ultraviolet light source device, comprising a collector mirror focusing extreme ultraviolet radiation at a focal point, wherein a porous plate having a plurality of through holes arranged such that only radiation focusing at said focal point passes is provided insertably between said collector mirror and said focal point on an optical axis of said collector mirror, and a detection means is provided to receive radiation having passed through said porous plate and to detect an intensity of said received radiation, and a method for detecting an irradiance distribution in an extreme ultraviolet light source device.

5 Claims, 6 Drawing Sheets

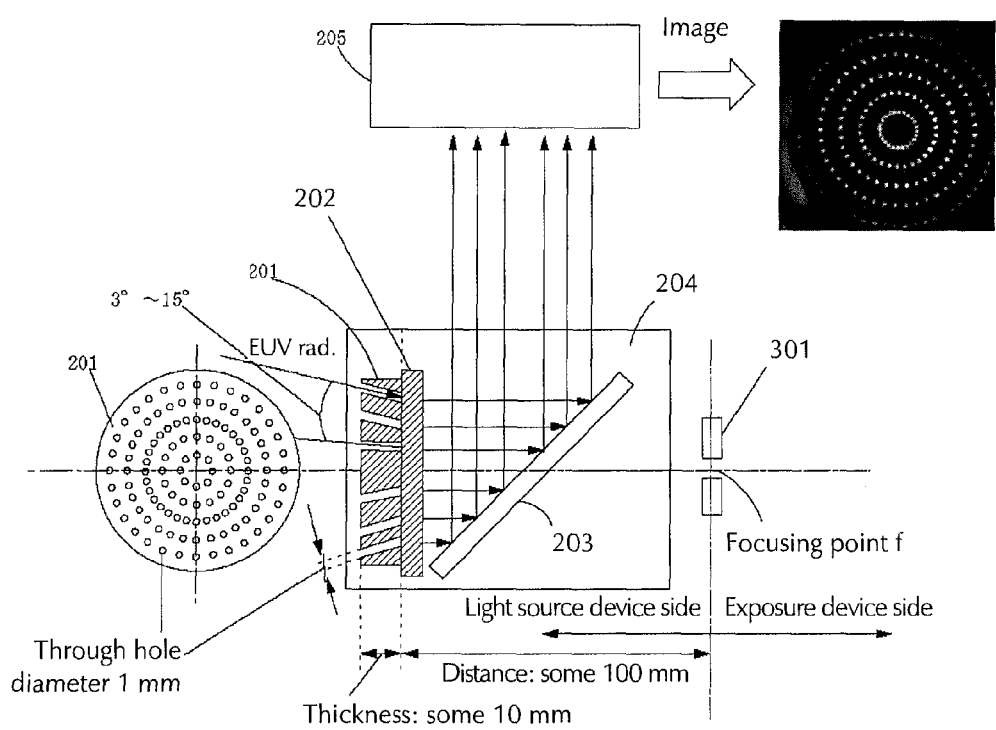
Fig. 2(a) (Front view)  Fig. 2(b) (Side view)  Fig. 2(c)

Fig. 3(a)
Backward monitor
(after focusing point f)
Fig. 3(b)
Forward monitor
(before focusing point f)
Fig. 3(c)
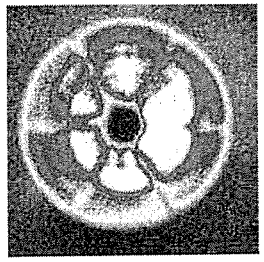
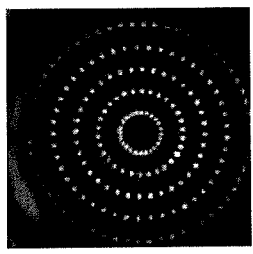
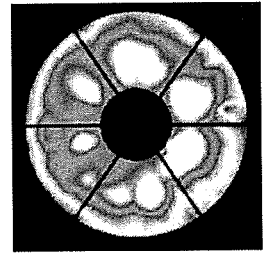
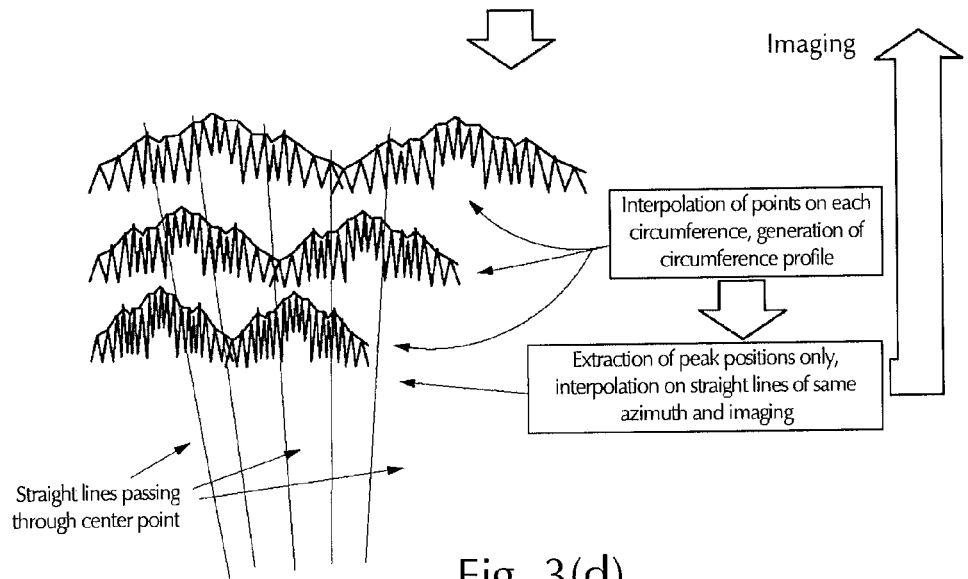
Fig. 3(d)

METHOD FOR THE DETECTION OF THE IRRADIANCE DISTRIBUTION IN AN EXTREME ULTRAVIOLET LIGHT SOURCE DEVICE AND AN EXTREME ULTRAVIOLET LIGHT SOURCE DEVICE

FIELD OF INVENTION

The present invention relates to a method for the detection of the irradiance distribution in an extreme ultraviolet light source device emitting extreme ultraviolet radiation and an extreme ultraviolet light source device being provided with a means to detect the irradiance distribution, and relates specifically to a method for the detection of the irradiance distribution in an extreme ultraviolet light source device wherein the irradiance distribution after an intermediate focal point can be measured without providing a measuring means after the intermediate focal point of the collector optical means of the EUV light source device, and an extreme ultraviolet light source device.

DESCRIPTION OF RELATED ART

With the downsizing and high integration of semiconductor integrated circuits, shorter wavelengths of the light sources for exposure are promoted, and the development of extreme ultraviolet light source devices (in the following also referred to as 'EUV light source devices') emitting extreme ultraviolet radiation (in the following also referred to as 'EUV (Extreme Ultra Violet) radiation') with a wavelength of especially, 13.5 nm as light sources for the exposure of semiconductors of the next generation is advanced.

FIG. 6 is a view to simply explain an EUV light source device described in JP-A-2007-505460 and corresponding U.S. Pat. No. 7,427,766 B2.

The EUV light source device has a chamber 1 being a discharge vessel. In the chamber 1a discharge part 1a accommodating a pair of disc-shaped electrodes 2a, 2b etc. and an EUV collecting part 1b accommodating a foil trap 5, an EUV collector mirror 6 being a focusing optical means etc. are provided. 1c is a gas evacuating unit to evacuate the discharge part 1a and the EUV collecting part 1b and to bring the interior of the chamber 1 to a vacuum state. 2a and 2b are disc-shaped electrodes. The electrodes 2a, 2b are spaced from each other by a defined spacing and are rotated by means of the rotation of respective rotary motors 16a, 16b with 16c, 16d as rotary shafts. 14 is a raw material for a high temperature plasma emitting EUV radiation with a wavelength of 13.5 nm. The high temperature plasma raw material 14 is a heated molten metal such as, for example, liquid tin, and is accommodated in containers 15. Said electrodes 2a, 2b are arranged such that a part thereof is immersed in the container 15 accommodating the high temperature plasma raw material 14. The liquid high temperature plasma raw material 14 having gotten onto the surface of the electrodes 2a, 2b is transported to the discharge space by means of the rotation of the electrodes 2a, 2b. Then, laser light 17 from a laser source 17a is radiated towards the high temperature plasma raw material 14 having been transported into said discharge space. The laser light 17 gasifies the irradiated high temperature plasma raw material 14.

When the high temperature plasma raw material 14 has been gasified by the irradiation with the laser light 17, a pulse discharge starts between both electrodes 2a, 2b by supplying a pulse current to the electrodes 2a, 2b from a current supply means 4, and a plasma P is formed from the high temperature plasma raw material 14. When the plasma is heated and excited by the large current flowing at the time of the discharge and is brought to a high temperature, EUV radiation is emitted from this high temperature plasma P.

The EUV radiation emitted from the high temperature plasma P is collected by the EUV collector mirror 6 at a focal point f (also referred to as 'intermediate focal point') of the EUV collector mirror 6 and is emitted from an EUV radiation emission opening 7 and is radiated into an exposure device 40 shown by dotted lines which is connected to the EUV light source device.

When the EUV light source device has been operated for a long time, there is the problem that a displacement in the alignment of the high temperature plasma P and the EUV collector mirror occurs, the characteristics of the distribution of the radiation intensity (in the following also referred to as 'irradiance distribution characteristics') of the EUV radiation after the intermediate focal point f worsen, and the distribution becomes asymmetrical.

As to the reasons for the irradiance distribution characteristics becoming asymmetrical, for example the following two reasons are conceivable.

(1) The position of the plasma foamed between the pair of discharge electrodes varies as compared to the start of the lighting because the discharge electrodes wear off during the time of the lighting operation.

(2) The EUV collector mirror reaches a high temperature because of the heat generated by the discharge electrodes and the high temperature plasma and is deformed by heat distortions.

When the irradiance distribution characteristics of the EUV radiation after the intermediate focal point f worsen and become asymmetrical, this may lead to exposure irregularities of the objects to be treated which are treated by the exposure device.

To avoid this problem, it is possible to insert a detection means (for example a CCD) at the light emission side of the reflecting mirror, which receives EUV radiation and detects the intensity of the received EUV radiation during the emission of EUV radiation. Then, the irradiance distribution is measured on the basis of the output from the inserted detection means and the position of the collector mirror is moved such that the measured irradiance distribution becomes uniformly. But this approach involves the following problems.

To measure the irradiance distribution characteristics of the EUV radiation after the intermediate focal point f, it is conceivable to provide a detection means detecting the intensity of the radiation after the intermediate focal point f. But, as was mentioned above, the region after the intermediate focal point f is a region belonging to the exposure device which is connected to the EUV light source device, and if a detection means is mounted at the exposure device side, it is not possible to measure the irradiance distribution characteristics of the EUV radiation at the EUV light source device itself. For example, it is not possible to measure the irradiance distribution characteristics to perform a positional regulation of the reflecting mirror during the production of the EUV light source device.

But when the detection means is inserted only between the collector mirror and the intermediate focal point f, also radiation which is not focused at the intermediate focal point f radiates into the detection means. Therefore, the irradiance distribution characteristics of the EUV radiation focusing at the intermediate focal point f cannot be measured.

As to the reason why radiation which is not focused at the intermediate focal point f radiates into the detection means, because of the spatial extent of the plasma P formed between the pair of discharge electrodes it is not the case that all EUV radiation emitted from the plasma P, although being reflected by the collector mirror, is focused at the intermediate focal point f. The EUV radiation being focused by the collector mirror 6 at the intermediate focal point f is in fact merely a part of the EUV radiation being emitted from the plasma P. Now, if also EUV radiation not focused at the intermediate focal point f radiates into the detection means, the irradiance distribution after the intermediate focal point f cannot be measured accurately.

Actually, when a detection means is simply inserted between the collector mirror 6 and the intermediate focal point f and the irradiance distribution of the EUV radiation is measured, the irradiance distribution detected by the detection means seems to be roughly uniform as a whole even if the irradiance distribution after the intermediate focal point f is non-uniform, and a detection that the irradiance distribution is non-uniform becomes impossible.

SUMMARY OF THE INVENTION

The present invention was made in view of the above situation, and the object of the present invention is to make it possible to perform the measurement of the irradiance distribution of an extreme ultraviolet light source device after the intermediate focal point at the extreme ultraviolet light source device itself without providing a means to measure the irradiance distribution at the exposure device side.

As the plasma emitting EUV radiation has a spatial extent in the EUV light source device according to the present invention, it is not the case that all of the reflected EUV radiation being emitted by said plasma and being reflected by the collector mirror focuses at the intermediate focal point of the EUV light source device. Now, in the present invention only EUV radiation focusing at the intermediate focal point is extracted from the EUV radiation being reflected by the collector mirror between the collector mirror and the intermediate focal point f. This extracted EUV radiation is utilized and the irradiance distribution fluctuations of the EUV radiation focusing at the intermediate focal point are detected by detecting the fluctuations of the extracted EUV radiation.

As to the method to extract only EUV radiation focusing at the intermediate focal point from the EUV radiation being reflected by the collector mirror, a porous plate is used in which a plurality of through holes is formed through which the EUV radiation focusing at the focal point passes. The plurality of through holes formed in the porous plate is arranged concentrically with the position through which the optical axis of the EUV radiation passes when the porous plate has been inserted into the optical path being the center. Further, the trough holes are formed angled so that straight lines connecting the positions at which these through holes are arranged and the intermediate focal point f can pass. Thus, only light which is directed to the intermediate focal point f among the EUV radiation being reflected by the collector mirror and being radiated to the porous plate can pass these through holes while light not being directed to the intermediate focal point f cannot pass and is blocked. Therefore, all light exiting the porous plate is light being directed to the intermediate focal point f.

It is possible to arrange a fluorescent screen (a scintillator) transforming EUV radiation into visible light at the light emission side of said porous plate and to transform the EUV radiation having passed through the porous plate into visible light. By means of this it is possible to detect the irradiance distribution of EUV radiation by using a detection means detecting visible light.

The radiation being detected by the detection means is a plurality of point-shaped radiations having passed through the plurality of through holes which are arranged concentrically, but if the data of the detected radiation (irradiance) are interpolated in the controller of the EUV light source device and an irradiance distribution image is reconstructed, it is possible to obtain an image which is close to irradiance distribution measurement results having been measured at a position after the intermediate focal point.

Basing on these above statements the present invention solves the above-mentioned problem as follows.

(1) A porous plate wherein a plurality of through holes is formed through which only radiation focusing at the focal point passes is inserted on the optical axis of a collector mirror between said collector mirror and the focal point of said collector mirror, and the irradiance distribution of extreme ultraviolet radiation having passed through said porous plate is measured. Then, the irradiance distribution at said focal point when said porous plate is not inserted is determined on the basis of the above irradiance distribution.

(2) A collector mirror focusing extreme ultraviolet radiation; a porous plate wherein a plurality of through holes is formed through which only radiation focusing at the focal point passes, and which is arranged insertably between said collector mirror and the focal point of said collector mirror on the optical axis of said collector mirror; and a detection means which receives the extreme ultraviolet radiation having passed through this porous plate and detects the intensity of this received radiation are provided in an extreme ultraviolet light source device.

(3) In the above-mentioned point (2), a fluorescent screen converting extreme ultraviolet radiation into visible light is provided at the light emission side of said porous plate.

As, according to the EUV light source device of the present invention, a means is provided between the collector mirror and the intermediate focal point which lets only EUV radiation pass focusing at the intermediate focal point and detects fluctuations of the irradiance distribution, fluctuations of the irradiance distribution characteristics of EUV radiation after the intermediate focal point, if such fluctuations of the irradiance distribution characteristics of extreme ultraviolet radiation should occur because of various reasons such as mentioned above, can be detected at the EUV light source device itself.

Because the fluctuations of the irradiance distribution characteristics of the EUV radiation after the intermediate focal point can be detected at the EUV light source device itself, a confirmation of the irradiance distribution characteristics can be performed during the production of the EUV device or during a replacement of the collector mirror and the position of the collector mirror can be regulated on the basis of the detected irradiance distribution characteristics of the EUV radiation such that ideal irradiance distribution characteristics of the EUV radiation are obtained.

BRIEF DESCRIPTION OF THE DRAWINGS

FIG. 2 is a view showing an enlargement of the portion of the detection means in FIG. 1.

FIG. 3 is a schematic view showing a comparison of an image of the irradiance distribution after the intermediate focal point f and an image received via the porous plate.

DETAILED DESCRIPTION OF THE INVENTION

Figure 1:
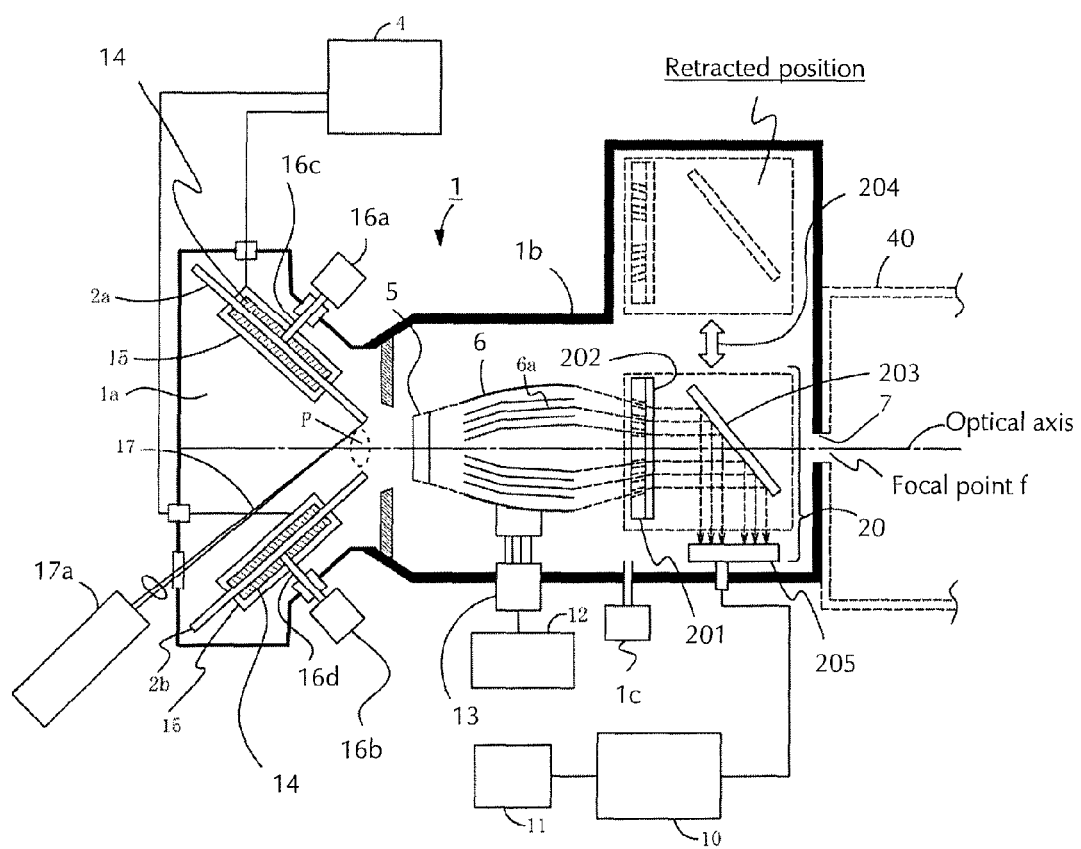
FIG. 1 is a view showing the schematical configuration of the structure of an EUV light source device of an embodiment of the present invention.
Figure 6:
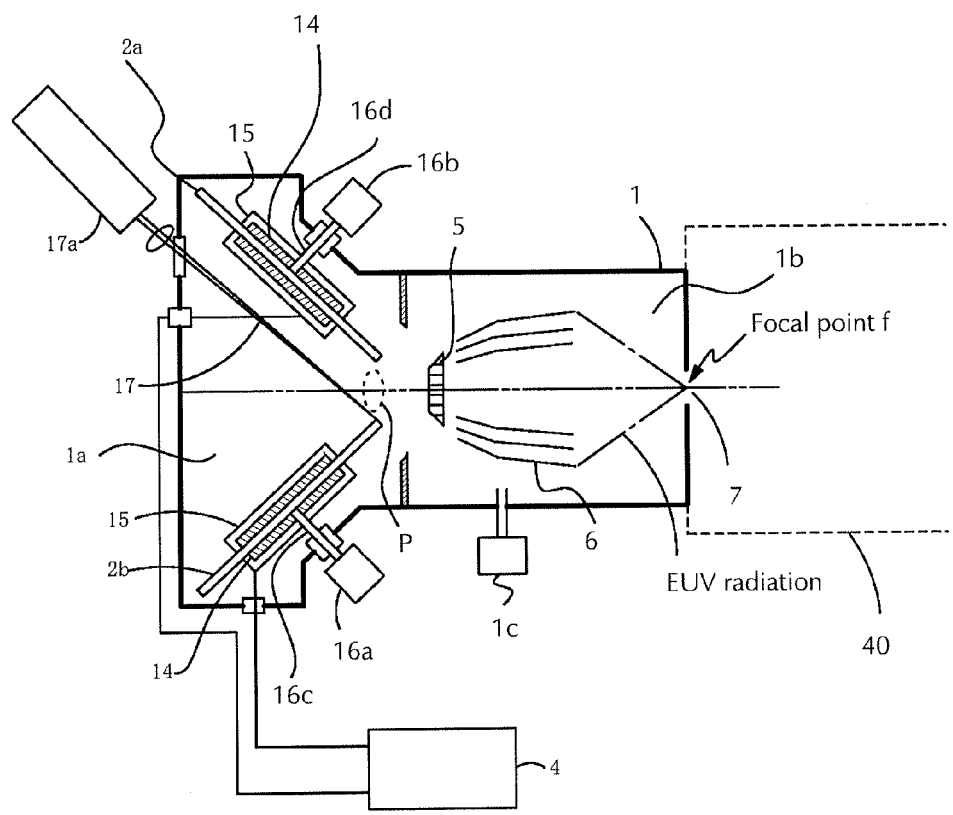
FIG. 6 is a view showing a configurational example of an EUV light source device.

FIG. 1 shows a schematic of the configuration of an EUV light source device of an embodiment of the present invention. As to the configuration of the EUV light source device, similar to that shown in FIG. 6 a chamber 1 is provided which comprises a discharge part 1a accommodating discharge electrodes 2a, 2b and an EUV collecting part 1b accommodating a foil trap 5 and a collector mirror (a focusing optical means) 6. At the chamber 1a gas evacuating unit 1c to evacuate the discharge part 1a and the EUV collecting part 1b and to bring the interior of the chamber 1 to a vacuum state is provided. The electrodes 2a, 2b being a pair of disc-shaped electrodes are spaced from each other by a defined spacing and are rotated by means of the rotation of respective rotary motors 16a, 16b with 16c, 16d as rotary shafts. 14 is a raw material for high temperature plasma emitting EUV radiation with a wavelength of 13.5 nm. The high temperature plasma raw material 14 is a heated molten metal, such as, for example, liquid tin, and is accommodated in containers 15.

Said electrodes 2a, 2b are arranged such that a part thereof is immersed in the container 15 accommodating the high temperature plasma raw material 14. The liquid high temperature plasma raw material 14 having gotten onto the surface of the electrodes 2a, 2b is transported to the discharge space by means of the rotation of the electrodes 2a, 2b. Then, laser light 17 from a laser source 17a is radiated towards the high temperature plasma raw material 14 having been transported into said discharge space. The laser light 17 gasifies the irradiated high temperature plasma raw material 14. When in this state a pulse current is supplied to the discharge electrodes 2a, 2b from a current supply means 4, a discharge is generated between the edge portion of the discharge electrode 2a and the edge portion of the discharge electrode 2b and a plasma P is formed from the high temperature plasma raw material 14. When this plasma is heated and excited by the large current flowing at the time of the discharge and is brought to a high temperature, EUV radiation is emitted from this high temperature plasma P.

At this time, a detection means 20 for detecting the EUV radiation focusing at the focal point f is located at a retracted position shown by dotted lines in the drawing. The EUV radiation having been emitted from the high temperature plasma P is collected by the EUV collector mirror 6 at the focal point f of the collector mirror 6, is emitted from an EUV radiation emission opening 7 and is radiated into an exposure device 40 shown by dotted lines, which is connected to the EUV light source device.

At the collector mirror 6 which is arranged in the EUV collecting part 1b, light reflecting faces 6a to reflect EUV radiation with a wavelength of 13.5 nm having been emitted from the high temperature plasma P are formed. The collector mirror 6 is comprised of a plurality of light reflecting faces 6a which are arranged interlaced while not contacting each other. Each light reflecting face 6a is designed for a good reflection of extreme ultraviolet radiation with an incident angle of 0 to 25° by means of thoroughly coating a metal such as Ru (ruthenium), Mo (molybdenum) or Rh (rhodium) onto the light reflecting surface of a substrate material with a smooth surface made from, e.g., nickel (Ni). Each light reflecting face 6a is configured such that the focal points f coincide.

The EUV light source device of the present invention has the object to detect irradiance distribution fluctuations of the EUV radiation after the focal point (intermediate focal point) f of the EUV light source device, and therefore the detection means 20 is provided. As the light having passed the intermediate focal point f radiates into the exposure device 40 which is connected to the EUV light source device, this detection means serves to avoid the generation of exposure irregularities at the article to be treated by the exposure treatment in the exposure device 40 because irradiance distribution fluctuations of the irradiance of the EUV radiation after the intermediate focal point f are detected.

As mentioned above, the plasma being formed between the pair of discharge electrodes of the EUV light source device has a spatial extent, because of which it is not the case that all reflected EUV radiation, although being emitted by the plasma P and being reflected by the reflecting faces 6a of the collector mirror 6, are focused at the intermediate focal point f. For the detection of irradiance distribution fluctuations of the EUV radiation focusing at the intermediate focal point f, the EUV radiation focusing at the intermediate focal point f is extracted from the EUV radiation being reflected by the reflecting faces 6a of the collector mirror 6, and the irradiance distribution characteristics are measured by means of the extracted EUV radiation.

In the following, the detection means detecting the EUV radiation focusing at the intermediate focal point f will be explained using FIG. 1 and FIG. 2.

As is shown in FIG. 1 and FIG. 2, the detection means 20 for extracting and detecting the EUV radiation focusing at the intermediate focal point f comprises a porous plate 201 which lets light containing EUV radiation focusing at the intermediate focal point f pass but blocks light containing EUV radiation not focusing at the intermediate focal point f; a scintillator (a fluorescent screen) 202 which converts EUV radiation having passed through the porous plate 201 into visible light; a reflecting mirror 203 which reflects light having been converted into visible light by the fluorescent screen 202 towards a light detector 205; and the light detector 205 which receives the light having been reflected by the reflecting mirror 203 and which outputs a signal according to the intensity of the received light. Further, in FIG. 1, a moving mechanism 204 is provided so that the porous plate 201, the scintillator (fluorescent screen) 202 and the reflecting mirror 203 of the detection means 20 can be inserted integrally into the optical path of the EUV radiation having been emitted from the collector mirror 6 and retracted therefrom.

FIG. 2 is a view showing an enlargement of the portion of the detection means 20. In this drawing an exposure device side is located to the right of the focal point f at which an aperture 301 is arranged, while the EUV light source device side is located to the left thereof. Then, in this drawing a front view (FIG. 2(a)) and a side view (FIG. 2(b)) of the porous plate 201 are shown.

As is shown in this drawing, a plurality of (about 200) through holes (pores with a diameter of for example 1 mm) through which extreme ultraviolet radiation focusing at the focal point f passes is formed in the porous plate 201. The plurality of through holes formed in the porous plate 201 is arranged concentrically with the position through which the optical axis of the EUV radiation passes when the porous plate 201 has been inserted into the optical path being the center. The material of the porous plate is aluminum, and at the surface thereof a black alumite treatment has been performed to avoid a diffuse reflection of the light.

The through holes are formed angled (as is shown in this drawing, the angle with regard to the direction of the optical axis is, for example, 3 to 15°) so that straight lines connecting the positions at which these through holes of the porous plate 201 are arranged and the intermediate focal point f can pass. Thus, only light which is directed to the intermediate focal point f among the EUV radiation being reflected by the collector mirror 6 and being radiated to the porous plate 201 can pass through these through holes while light not being directed to the intermediate focal point f cannot pass and is blocked. Therefore, all light exiting the porous plate 201 becomes light which is directed to the intermediate focal point f. The longer the distance the EUV radiation passes, that is, the longer the length of the holes, the more precisely only light being directed towards the intermediate focal point f can be emitted by the porous plate 201. Therefore, a larger plate width of the porous plate 201 is preferred, but practically a plate with a width of 10 mm to 30 mm is used.

The EUV radiation having passed through the porous plate 201 is converted into visible light by means of the fluorescent screen (scintillator) 202 which is arranged at the light emission side of the porous plate. At the fluorescent screen 202 only the portion of the plurality of concentric through holes formed in the porous plate 201 into which EUV radiation radiates lights up. The brightness of each point of the through holes corresponds to the intensity of the EUV radiation. Further, the lighting condition of the fluorescent screen 202 is reflected by the reflecting mirror 203 and is detected by the light detector 205. The light detector 205 is, for example, a CCD, and the light receiving portion sends the received irradiance data as electric signals to a image processing part 10.

As is shown in FIG. 2(c), the image by the image processing part 10 on the basis of the irradiance data received from the light detector 205 is an image of a plurality of punctiform lights having passed through the concentrically arranged plurality of through holes. The image processing part 10 interpolates the data of the intensity of each punctiform light on the basis of the intensity of each punctiform light and reconstructs an image of the irradiance distribution after the intermediate focal point f. The image of the irradiance distribution having been reconstructed by the image processing part 10 is, for example, displayed at a monitor 11.

As is shown in FIG. 1, the detection means 20 comprises a moving mechanism 204 so that an insertion into the optical path of the EUV radiation being emitted from the collector mirror 6 and a retraction therefrom is possible. Therefore, the detection means 20 can be retracted by said moving mechanism 204 during the operation of the EUV light source device to an upper retracted position shown in dotted lines in the drawing. While the EUV light source device is paused, the detection means 20 is moved by said moving mechanism 204 to the position shown by continuous lines, and the EUV light source is operated and the irradiance distribution can be measured by the detection means 20.

Further, at the collector mirror 6 a collector mirror position moving means 13 for moving the collector mirror 6 is provided, and this collector mirror position moving means 13 is driven by a position regulating means 12. Therefore, the irradiance distribution can be verified by moving the detection means 20 to the position shown by continuous lines in the drawing, and if the irradiance distribution shown at the monitor 11 worsens with regard to an initial irradiance distribution having been measured in advance, the collector mirror position moving means 13 is driven by the position regulating means 12 and the position of the collector mirror 6 can be corrected. That is, the collector mirror position moving means 13 is driven by the position regulating means 12 and the position of the collector mirror 6 is moved such that the reconstructed irradiance distribution becomes good, and thus the irradiance distribution of the EUV radiation focusing at the focal point f and radiating into the exposure device can be improved.

FIG. 3 shows a comparison of an image (a) of the irradiance distribution of the EUV radiation after the intermediate focal point f, an image (b) received by the light detector 205 via the porous plate 201, and an image (c) of the irradiance distribution reconstructed by the image processing part 10.

Figure 4:
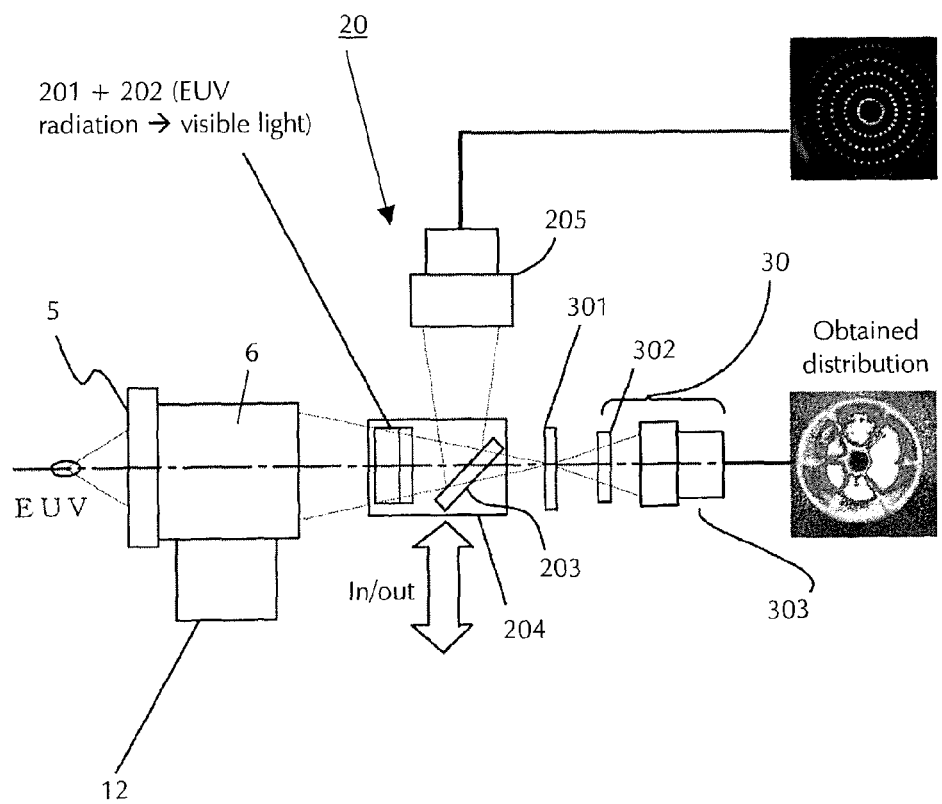
FIG. 4 is a schematic view showing the configuration of the device which is used to obtain the images of FIG. 3.

The images shown in FIG. 3 were measured such as is shown in FIG. 4. That is, as is shown in FIG. 4, an aperture 301 was arranged at the intermediate focal point f of the EUV radiation while the detection means 20 measuring the irradiance distribution of the EUV radiation via the porous plate 201 mentioned above was arranged at the collector mirror 6 side of the intermediate focal point f with said arranged aperture 301. Further, a second detection means 30 comprising a fluorescent screen 302 and a light detector 303 for measuring the irradiance distribution of EUV radiation was arranged after the intermediate focal point f (at that side of the intermediate focal point f which is opposite to the collector mirror 6). The detection means 20 having the porous plate 201 was inserted at the position in the drawing and the irradiance distribution of the EUV radiation measured via the porous plate 201 was measured, and then said detection means 20 was retracted from the optical path of the EUV radiation and the irradiance distribution of the EUV radiation focusing at the intermediate focal point f was measured by said detection means 30 while no porous plate 201 was provided. Then both were compared.

FIG. 3(a) is the irradiance distribution of the EUV radiation focusing at the intermediate focal point f (measured at a position after the intermediate focal point f having been set in advance), (b) is the irradiance distribution of the EUV radiation measured via the porous plate, and (c) is the irradiance distribution for which the irradiance distribution (b) was reconstructed by the image processing part 10. The white regions are regions where the intensity of the EUV radiation is high while the grey to black regions are regions where the intensity of the EUV radiation is low.

The reconstructed image of FIG. 3(c) is an image which has been reconstructed by interpolating the image of FIG. 3(b). That is, the irradiances of the measurement points being arranged concentrically shown in FIG. 3(b) were interpolated on the same circumference, the irradiance distributions on the concentric circles were determined and then the center of the concentric circles and each point on the circumferences were connected with straight lines, as is shown in FIG. 3(d), and the irradiance distributions on the straight lines were interpolated, by means of which the image shown in FIG. 3(c) was reconstructed.

In FIG. 3(a), there is a region at the right side of the image where the intensity of the EUV radiation is high, and also in the image of FIG. 3(c) there is a region with a high intensity of the EUV radiation at the right side. Thus, the irradiance distribution reconstructed on the basis of the EUV radiation measured via the porous plate shows the same distribution as the irradiance distribution of the EUV radiation focusing at the intermediate focal point f, and both are correlated. If, therefore, the position of the collector mirror 6 is regulated on the basis of the EUV radiation detected by the detection means 20 via the porous plate such that the irradiance distribution of this EUV radiation becomes uniform, the irradiance distribution of the EUV radiation focusing at the intermediate focal point f can be rendered uniformly. So, according to the present embodiment it is possible to detect fluctuations of the irradiance distribution characteristics of the EUV radiation after the intermediate focal point at the EUV light source device itself, and by inserting the detection means 20 into the optical path of the EUV radiation it is possible to confirm the irradiance distribution characteristics at the time of the production of the EUV light source device or when the operation of the EUV light source device is paused, and it is possible to regulate the position of the collector mirror on the basis of the detected irradiance distribution characteristics of the extreme ultraviolet radiation such that ideal irradiance distribution characteristics of the extreme ultraviolet radiation are achieved. Further, the regulation of the position of the collector mirror 6 by means of the irradiance distribution having been reconstructed on the basis of the EUV radiation detected via the porous plate can also be used for regulations of the position of the collector mirror when a collector mirror 6 is replaced with a new one.

In said embodiment, the explanation was made with an EUV light source device emitting EUV radiation by means of a discharge occurring between discharge electrodes as an example, but there are also EUV light source devices wherein no discharge electrodes are provided, and the method for regulating the collector mirror position of the present invention can also be applied to such devices.

Figure 5:
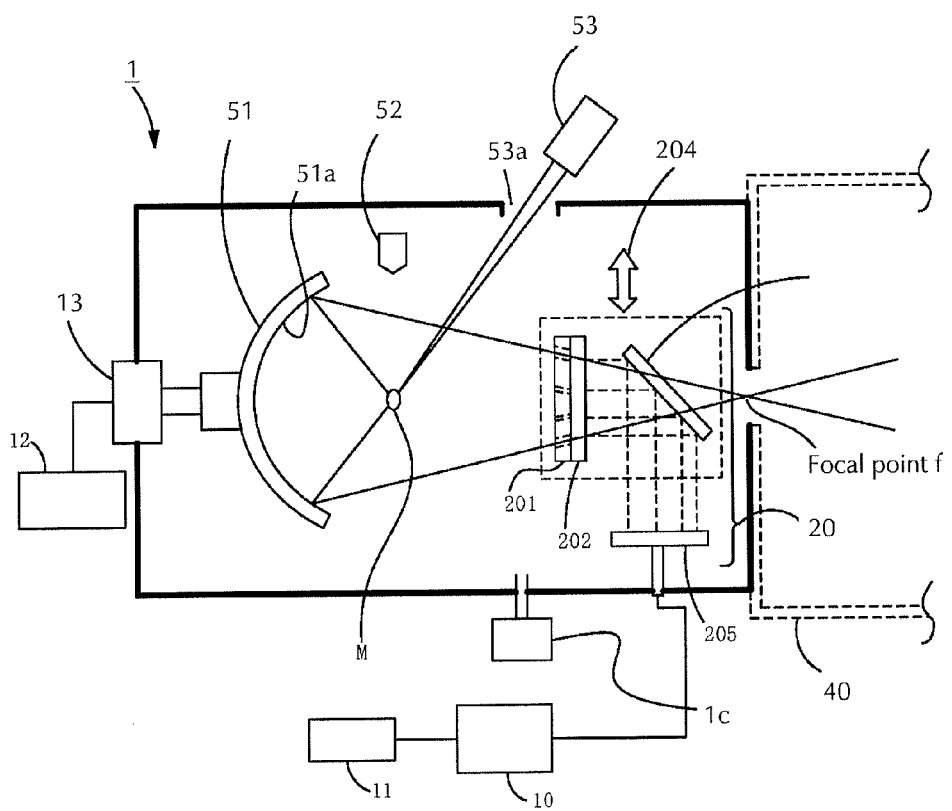
FIG. 5 is a view showing the schematical configuration when the present invention is applied to an EUV light source device wherein no discharge electrodes are provided.

FIG. 5 shows the schematic of a configuration wherein the present invention is applied to an EUV light source device which does not comprise discharge electrodes. The EUV light source device comprises a chamber 1 wherein a collector mirror 51 being a focusing optical means is accommodated. The collector mirror 51 is formed with a light reflecting surface 51a to reflect EUV radiation with a wavelength of 13.5 nm having been emitted from a high temperature plasma and to focus this light at a focal point f. At the chamber 1a gas evacuating unit 1c to bring the interior of the chamber 1 to a vacuum state is provided. At the light reflection surface 51a side of the collector mirror 51 the EUV light source device is provided with a raw material supply means 52 which supplies a liquid or solid raw material M for the generation of a high temperature plasma by dropping (dripping). The raw material M is, for example, tin (Sn) or lithium (Li).

The EUV light source device is provided with a high-output laser device 53 which radiates a laser beam with an extremely high energy towards the raw material M supplied by the raw material supply means 52. The laser beam having an extremely high energy is radiated from the high-output laser device 53 via a laser entrance window 53a towards the raw material M for a high temperature plasma supplied by the raw material supply means 52 at the light reflection surface 51a side of the collector mirror 51. By means of this the raw material M is made a high temperature plasma which emits EUV radiation with a wavelength of 13.5 nm. The EUV radiation emitted from the high temperature plasma is reflected by the light reflection surface 51a of the collector mirror 51 and is focused at the focal point f. But, as was mentioned above, because the generated plasma has a spatial extent, it is not the case that all reflected EUV radiation, although being emitted from the plasma and being reflected by the collector mirror 51, is focused at the intermediate focal point f. There is a portion which is not focused at the intermediate focal point f but is radiated to the periphery of the intermediate focal point f.

Now, similar to the embodiment described above, a detection means 20 for detecting the EUV radiation via a porous plate 201 is arranged on the optical axis of the collector mirror 51 between the collector mirror 51 and the focal point (intermediate focal point) f of the collector mirror 51 and measures the irradiance distribution of the EUV radiation. As was mentioned above, the detection means 20 comprises a porous plate 201 which lets light containing EUV radiation focusing at the intermediate focal point f pass but blocks light containing EUV radiation not focusing at the intermediate focal point f; a scintillator (a fluorescent screen) 202 which converts EUV radiation having passed through the porous plate 201 into visible light; a reflecting mirror 203 which reflects light having been converted into visible light by the fluorescent screen 202 towards a light detector 205; and the light detector 205 which receives the light having been reflected by the reflecting mirror 203 and which outputs a signal according to the intensity of the received light. As was mentioned above, the irradiance distribution of the EUV radiation focusing after the focal point f can be measured by providing said detection means 20. Therefore, the position of the collector mirror 51 can be moved and the irradiance distribution fluctuations of the EUV radiation focusing at the intermediate focal point f can be corrected by using the irradiance distribution having been reconstructed on the basis of the measured EUV radiation.

Now, in the above embodiments the light having passed through the porous plate is converted into visible light by using the scintillator (fluorescent screen) 202, but if a light detector which is able to directly measure EUV radiation is used, it is not necessary to employ the fluorescent screen 202.

What is claimed is:

1. A method for detecting an irradiance distribution in an extreme ultraviolet light source device, said extreme ultraviolet light source device being provided with a focusing optical means for reflecting and focusing extreme ultraviolet radiation and comprising a collector mirror, said collector mirror having a focal point, wherein a porous plate having a plurality of through holes arranged such that only radiation focusing at said focal point passes and is inserted on an optical axis of said collector mirror between said collector mirror and said focal point;

the irradiance distribution of radiation having passed through said porous plate is measured; and an irradiance distribution at said focal point when said porous plate is not inserted is determined on the basis of said irradiance distribution.

2. The method of claim 1, wherein a fluorescent screen converting extreme ultraviolet radiation into visible light is provided at a light emission side of said porous plate and visible light is measured for determining the irradiance distribution.

3. An extreme ultraviolet light source device, comprising a collector mirror focusing extreme ultraviolet radiation at a focal point, wherein a porous plate having a plurality of through holes is arranged such that only radiation focusing at said focal point passes is provided insertably between said collector mirror and said focal point on an optical axis of said collector mirror, and a detection means is provided to receive radiation having passed through said porous plate and to detect an intensity of said received radiation.

4. The extreme ultraviolet light source device according to claim 3, wherein a fluorescent screen converting extreme ultraviolet radiation into visible light is provided at a light emission side of said porous plate.

5. The extreme ultraviolet light source device according to claim 4, wherein the detection means is adapted to measure the visible light intensity.

\* \* \* \* \*